United States Patent [19]

Sampson, III

[11] 4,345,170

[45] Aug. 17, 1982

[54] CLOCKED IGFET LOGIC CIRCUIT

[75] Inventor: George P. Sampson, III, Bernardsville, N.J.

[73] Assignee: Bell Telephone Laboratories, Incorporated, Murray Hill, N.J.

[21] Appl. No.: 178,901

[22] Filed: Aug. 18, 1980

[51] Int. Cl.³ .............. H03K 19/003; H03K 19/096; H03K 19/20; H03K 17/16

[52] U.S. Cl. .................................. 307/443; 307/452; 307/579

[58] Field of Search ............... 307/443, 449, 452-453, 307/463, 481, 577, 579, 583

[56] References Cited

U.S. PATENT DOCUMENTS

| | | | |
|---|---|---|---|
| 3,567,968 | 3/1971 | Booher | 307/453 X |
| 3,702,945 | 11/1972 | Faith et al. | 307/443 |
| 3,829,710 | 8/1974 | Hirasawa et al. | 307/452 |
| 3,982,138 | 9/1976 | Luisi et al. | 307/481 |
| 3,999,081 | 12/1976 | Nakajima | 307/452 X |
| 4,040,015 | 8/1977 | Fukuda | 307/452 X |
| 4,061,929 | 12/1977 | Asano | 307/296 A |

OTHER PUBLICATIONS

Stewart, "High-Density CMOS ROM Arrays", *IEEE Journal of Solid-State Circuits*, vol. SC-12, No. 5, pp. 502-506; 10/77.

*Primary Examiner*—Larry N. Anagnos
*Attorney, Agent, or Firm*—Arthur J. Torsiglieri

[57] ABSTRACT

A clocked IGFET serial decoder circuit has a precharge transistor with its conduction channel connected between a $V_{DD}$ supply and an output terminal, a string of transistors with their conduction channels connected in series between the output terminal and a switch ground node and a ground switch transistor with its conduction channel connected between the switch ground node and a $V_{SS}$ supply. The gates of the transistors of the string receive input signals from clocked input buffers which bias the gates at $V_{DD}$ during the precharge interval when the precharge transistor is ON and the ground switch transistor is OFF. This allows the parasitic capacitances at the junctures of the transistors in the string to become substantially charged during the precharge interval and thus prevent rapid charge sharing at the output terminal when the circuit is enabled.

2 Claims, 2 Drawing Figures

CLOCKED IGFET LOGIC CIRCUIT

BACKGROUND OF THE INVENTION

This invention relates to insulated-gate fieldeffect transistor (IGFET) logic circuits and more particularly to a clocked IGFET logic circuit having provisions for reducing output noise caused by rapid charge sharing at its output terminal.

Clocked IGFET logic circuits which perform predetermined logical functions on a plurality of input signals synchronously with a system or subsystem clock are well known in the art. Generally, clocked IGFET logic circuits are dynamic and have the advantages of low power dissipation, high performance and low device count. A typical example of such a circuit includes a precharge transistor having its conduction channel connected between a $V_{DD}$ supply terminal and an output terminal, a functional network connected between the output terminal and a switch ground node, and a ground switch transistor having a conduction channel connected between the switch ground node and a $V_{SS}$ supply terminal. The functional network includes a plurality of transistors each having a gate connected to a respective one of a plurality of input signals and a conduction channel which is connected together with those of the other transistors of the functional network in a configuration which provides the circuit with the predetermined logical function. When the functional network includes transistors which have their conduction channels connected in series, the circuit may exhibit noise steps in the output signal caused by rapid charge sharing at the output terminal. This problem of noise steps is now explained with the aid of FIG. 1.

Referring now to FIG. 1 there is shown a schematic diagram of a clocked logic circuit 100 implemented in CMOS technology and operating between a positive $V_{DD}$ supply potential and a $V_{SS}$ supply potential which in the present case is ground. The supply potentials are applied to the circuit through a $V_{DD}$ supply terminal and a $V_{SS}$ supply terminal, respectively. A p-channel precharge transistor Q1 has its source electrode 101 connected to the $V_{DD}$ supply terminal and its drain electrode 102 connected to an OUTPUT terminal. Since IGFETs are in general bilateral devices the distinction between source and drain electrodes is not essential to the description of the circuit, and transistor Q1 can be described simply as having a conduction channel connected between the $V_{DD}$ and OUTPUT terminals. As is well known, the electrical conductance of the channel of an IGFET is controlled by the bias potential applied to the gate of the transistor and can be varied from a relatively high value when the transistor is driven into its ON state to a vanishingly small value when the transistor is driven into its OFF state.

Connected between the OUTPUT terminal and a switch ground node 104 is a functional network 105 containing four n-channel transistors Q2, Q3, Q4, and Q5 with their conduction channels connected in series and their gates respectively connected to four INPUT terminals 106 through 109. The series connection of the conduction channels of the transistors of the functional network provides the circuit with the NAND logical function performed on four input signals A0, A1, A2 and A3 received at the input terminals. The switch ground node 104 is coupled to the $V_{SS}$ supply terminal through the conduction channel of an n-channel ground switch transistor Q6.

Associated with each of the junctures of transistors Q2 through Q6 are parasitic distribution and junction capacitances denoted by C1, C2, C3, and C4. Capacitance C5 associated with the OUTPUT terminal includes the parasitic junction capacitances of transistors Q1 and Q2 as well as a load capacitance. The capacitance C5 is typically larger than any of the other parasitic capacitances.

The gate 103 of transistor Q1 and the gate 101 of transistor Q6 both receive a clock signal having CMOS logic levels of $V_{DD}$ for a logic "1" and $V_{SS}$ for a logic "0". When the clock signal is at a logic "0" level, the circuit is in a precharge phase with transistor Q1 turned ON and transistor Q6 turned OFF, and the OUTPUT terminal is pulled up to $V_{DD}$ through transistor Q1. When the clock signal is at a logic "1" level, the circuit is in an active phase with transistor Q1 turned OFF and transistor Q6 turned ON. Under these conditions, the logic level at the OUTPUT terminal is a NAND function of the state of the input signals A0 through A3. For example, if input signals A0 through A3 were all at the logic "1" level during the active phase, transistors Q2 through Q5 would all be turned ON creating a current path between the OUTPUT terminal and the switch ground node and causing the OUTPUT terminal to be pulled to the logic "0" level of $V_{SS}$ through the current path and transistor Q6. For all other states of the input signals A0 through A3 there would be no current path through the functional network and the OUTPUT terminal would be maintained at the logic "1" level ($V_{DD}$) by the charge stored in the capacitance C5 at that terminal.

If in a given active phase A0 through A3 were all at the logic "1" level, parasitic capacitances C1 through C4 would all be discharged to ground potential ($V_{SS}$). If in the following precharge phase A0 goes to the logic "0" level while A1 through A3 remain at the logic "1" level, C1 through C4 would remain discharged while C5 charges up to $V_{DD}$. If in the next active phase A0 goes to the logic "1" level, A1 and A2 remain at the logic "1" level and A3 goes to the logic "0" level the potential level at the OUTPUT terminal is expected to remain at $V_{DD}$ (logic "1" level) owing to the NAND logic function. However, because capacitances C2, C3 and C4 were initially discharged, transistors Q2, Q3 and Q4 whose source electrodes are initially at $V_{SS}$ would temporarily turn ON when their gates are biased at $V_{DD}$ causing charge to flow rapidly from C5 into C2, C3, and C4 until those transistors are eventually turned OFF by the substrate bias effect. This rapid charge sharing between C2, C3, C4 and C5 causes the potential level at the OUTPUT terminal to exhibit a rapid drop or negative-going step. Such negative-going steps in the output signal of the circuit are undesirable inasmuch as the magnitudes of such steps may exceed the noise margin of another circuit which receives the output signal and trigger an erroneous switching of the receiving circuit.

Therefore, a need clearly exists for an improved clocked IGFET logic circuit which avoids the problem of noise steps caused by rapid charge sharing.

SUMMARY OF THE INVENTION

Accordingly, the above and other deficiencies of the prior art are ameliorated by the present invention which is a clocked logic circuit for providing during a first phase of a clock signal an output signal which is a predetermined logical function of the state of a plurality of input signals and for providing during a second phase of the clock signal an output signal at a first logic level. The circuit comprises: means for providing the clock signal, first and second terminals respectively adapted to receive a first and second operating potential, a plurality of input means adapted to receive respective input signals, and an output terminal for providing the output signal. In addition the circuit includes: a first IGFET having a conduction channel coupled between the first terminal and the output terminal and a gate electrode, and means coupled to the gate electrode of the first IGFET and being responsive to the clock signal for biasing the first IGFET to the ON state during the second phase of the clock signal and for biasing the first IGFET to the OFF state or to have a relatively low channel conductance during the first phase of the clock signal. Furthermore, the circuit includes a functional network coupled between the output terminal and a first node, the network comprising a plurality of IGFETs each having a gate electrode coupled to a respective one of the input means and a conduction channel, the conduction channels of the IGFETs of the functional network being coupled in a configuration to provide the circuit with the predetermined logical function, the configuration having two or more conduction channels coupled in series. The circuit also includes a second IGFET having a conduction channel coupled between the first node and the second terminal and a gate electrode, and means coupled to the gate electrode of the second IGFET and being responsive to the clock signal for biasing the second IGFET to the ON state during the first phase of the clock signal and for biasing the second IGFET to the OFF state during the second phase of the clock signal. The circuit is characterized in that the plurality of input means are responsive to the clock signal for providing the input signals to respective gate electrodes of the IGFETs of the functional network during the first phase of the clock signal and for providing the first logic level to the gate electrodes of the IGFETs of the functional network during the second phase of the clock signal.

DETAILED DESCRIPTION

Figure 1:
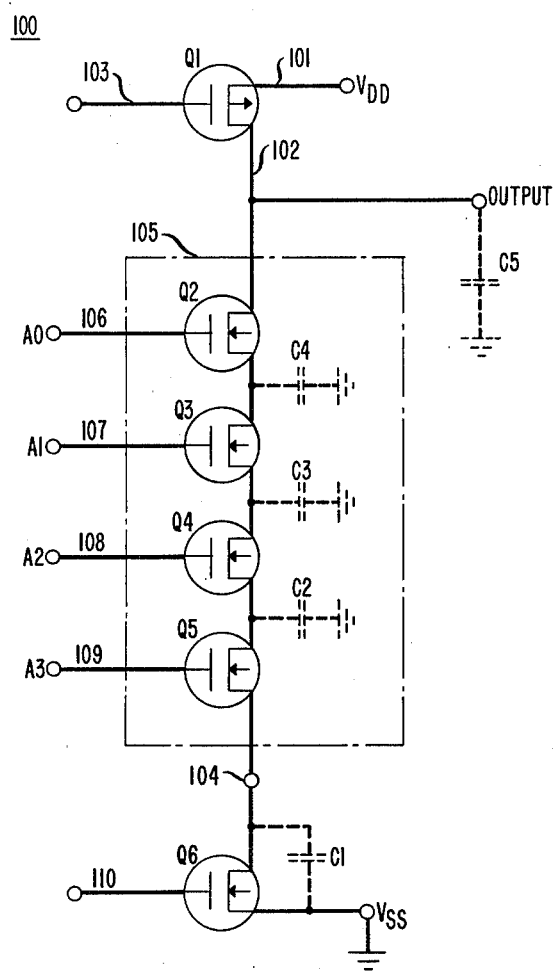
FIG. 1 is a schematic diagram of a clocked 4-input NAND gate circuit implemented in CMOS according to the prior art.
Figure 2:
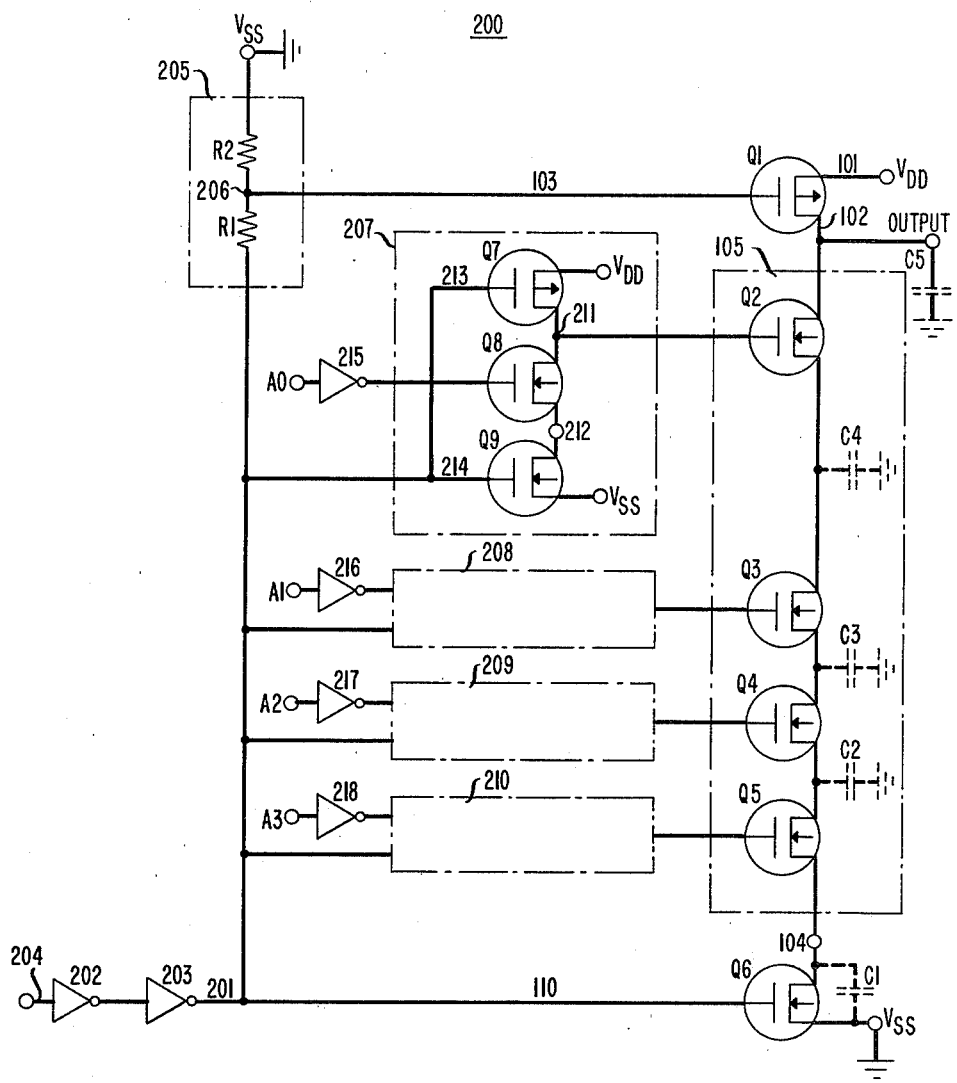
FIG. 2 is a schematic diagram of a clockked 4-input NAND gate circuit implemented in CMOS according to one embodiment of the present invention.

Referring now to FIG. 2, the portion of the depicted circuit which includes the precharge transistor Q1, the functional network 105 and the ground switch transistor Q6 is the same as the prior art circuit depicted in FIG. 1. Therefore, the same reference characters used to refer to the circuit and parasitic elements of FIG. 1 are also being used to refer to the corresponding elements in FIG. 2.

The gate 110 of transistor Q6 is connected to the output terminal 201 of a clock driver circuit comprising two inverter stages 202 and 203. The clock driver circuit receives a system or subsystem clock at its input terminal 204 and provides a clock signal having CMOS logic levels at its output terminal. The gate 103 of transistor Q1 is connected to a tap terminal 206 of a voltage divider chain 205 which is connected between the output terminal 201 of the clock driver circuit and the $V_{SS}$ supply terminal. The ratio of resistance R1 to resistance R2 of the voltage divider chain is chosen such that during the active phase when the clock signal is at the logic "1" level the tap terminal provides a potential level which biases transistor Q1 to have a relatively low channel conductance sufficient to sustain a logic "1" level at the OUTPUT terminal in the face of parasitic leakage currents and slow charge sharing at that terminal. During the precharge phase when the clock signal is at the logic "0" level, the tap terminal is pulled to substantially $V_{SS}$ to bias transistor Q1 to the ON state. A clocked IGFET logic circuit having means for biasing the precharge transistor to have a relatively low channel conductance during the active phase of the clock is specifically claimed in a concurrently filed, copending application having Ser. No. 178,899.

The gates of the four series connected transistors Q2 through Q5 of the functional network are each connected to one of four identical buffer circuits represented by blocks 207 through 210. For simplicity, the details of the input buffer circuit are depicted only in block 207.

Each input buffer circuit has a p-channel transistor Q7 having its conduction channel connected between the $V_{DD}$ terminal and an output node 211, an n-channel transistor Q8 having its conduction channel connected between the output node 211 and a node 212, and a second n-channel transistor Q9 having its conduction channel connected between node 212 and the $V_{SS}$ terminal. The gates of transistors Q7 and Q9 (213 and 214, respectively) are both connected to the output terminal 201 of the clock driver circuit. The gate of transistor Q8 receives one of the input signals A0 through A3 complemented by one of four inverters 215 through 218 which is associated with the input buffer circuit.

During the precharge phase when the output terminal 201 is at a logic "0" level, transistor Q7 in each input buffer is turned ON while transistor Q9 in each input buffer is turned OFF, and the gates of transistors Q2 through Q5 are all biased at the logic "1" level of $V_{DD}$. However, during the active phase of the clock when output terminal 201 is at the logic "1" level, transistor Q7 in each input buffer is turned OFF while transistor Q9 in each input buffer is turned ON, and the input buffers provide (at terminal 211) the input signals A0 through A3 to respective gates of transistors Q2 through Q5.

Because the input buffers 207 through 210 bias the gates of transistors Q2 through Q5 at the logic "1" level during the precharge phase of the clock the parasitic capacitances C2, C3, and C4 are each charged to approximately $V_{DD}$-$V_{TH}$, where $V_{TH}$ is the threshold voltage of the transistors in the circuit. Therefore, during the active phase of the clock, rapid charge sharing between capacitances C5, C2, C3, and C4 cannot occur since transistors Q2 through Q5 with their source electrodes biased at $V_{DD}$-$V_{TH}$ cannot be turned ON by a bias of $V_{DD}$ (logic "1" level) on their gate electrodes. Thus, the above-described output noise steps which arise from rapid charge sharing are largely avoided by the use of such input buffers.

The input buffers are designed to have sufficient switching speed to insure that when the output terminal 211 goes to the logic "1" level the $V_{DD}$ bias is removed from the gates of transistors Q2 through Q5 and the input signals are applied to those gates before transistor Q6 is turned ON. This is achieved by providing the conduction channels of transistors Q8 and Q9 with relatively large width to length ratios and by minimizing the resistances and capacitances of the connections between terminal 211 of the input buffers and the gates of transistors Q2 through Q5.

Although the disclosed embodiment of the present invention uses input buffers having a specific circuit configuration, other types of circuits for performing similar functions to those performed by the input buffers of the disclosed embodiment may be substituted.

Although the disclosed embodiment of the present invention is implemented in CMOS, clocked logic circuits according to the present invention may also be implemented in other IGFET technologies such as p-channel metal-oxide-semiconductor technology (PMOS) and n-channel metal-oxide-semiconductor technology (NMOS) with appropriate modifications to the polarities and magnitudes of the supply potentials, bias potential levels and logic levels as would be obvious to one skilled in the art of IGFET circuit design.

It will be understood by those skilled in the art that the foregoing and other modifications and alterations may be made to the described embodiment witnhout departing from the spirit and scope of the present invention. For example, the transistors of the functional network may have their conduction channels connected in a configuration which provide the circuit with another logical function instead of the NAND function, and separate clock signals having an appropriate relationship may be respectively applied to the input buffers and to the gate of transistor Q6 to insure that the $V_{DD}$ bias is removed from the gates of transistors Q2 through Q5 and the input signals are applied to those gates prior to or simultaneously with the turning ON of Q6.

I claim:

1. A clocked logic circuit comprising:
   means for providing a clock signal having a first and a second phase;
   first and second terminals respectively connectable to receive a first and a second operating potential;
   a plurality of input means for receiving respective input signals;
   an output terminal for providing an output signal;
   a first IGFET having a conduction channel coupled between the first terminal and the output terminal and a gate electrode;
   means coupled to the gate electrode of the first IGFET and being responsive to the clock signal for biasing the first IGFET to the ON state during the second phase of the clock signal and for biasing the first IGFET to the OFF state or to have a relatively low channel conductance during the first phase of the clock signal;
   a functional network coupled between the output terminal and a first node, the network comprising a plurality of IGFETs each having a gate electrode coupled to a respective one of the input means and a conduction channel, the conduction channels of the IGFETs of the functional network being coupled in a configuration to provide the circuit with a predetermined logical function, the configuration having two or more conduction channels coupled in series,
   a second IGFET having a conduction channel coupled between the first node and the second terminal and a gate electrode;
   means coupled to the gate electrode of the second IGFET and being responsive to the clock signal for biasing the second IGFET to the OFF state during the second phase of the clock signal and for biasing the second IGFET to the ON state during the first phase of the clock signal;
   characterized in that the plurality of input means are responsive to the clock signal for providing the respective input signals to the gate electrodes of the IGFETs of the functional network during the first phase of the clock signal and for providing substantially the first operating potential to the gate electrodes of the IGFETs of the functional network during the second phase of the clock signal whereby noise at the output terminal is reduced.

2. A clocked logic circuit as recited in claim 1 wherein the first IGFET is of a first channel conductivity type, the IGFETs of the functional network are of a second channel conductivity type, the second IGFET is of the second channel conductivity type, the means for providing the clock signal includes a clock driver circuit having an input terminal for receiving a source of the clock signal and an output terminal at which is provided the clock signal having a first logic level during its first phase and a second logic level during its second phase, the means coupled to the gate of the second IGFET comprise a connection between the output terminal of the clock driver circuit and the gate electrode of the second IGFET, and further characterized in that each of the plurality of input means includes inverter means for complementing the input signal received by the input means and a buffer circuit comprising a third IGFET of the first channel conductivity type having a conduction channel coupled between the first terminal and a second node, and a gate electrode coupled to the output terminal of the clock driver circuit, a fourth IGFET of the second channel conductivity type having a conduction channel coupled between the second node and a third node and a gate electrode coupled to receive the complemented input signal from the inverter means, and a fifth IGFET of the second channel conductivity type having a conduction channel coupled between the third node and the second terminal and a gate electrode coupled to the output terminal of the clock driver circuit.

* * * * *